(12) United States Patent
Sakuragi

(10) Patent No.: US 7,595,474 B2
(45) Date of Patent: Sep. 29, 2009

(54) PHOTOELECTRIC CONVERSION APPARATUS, PHOTOELECTRIC CONVERSION SYSTEM, AND METHOD OF DRIVING THE SAME

(75) Inventor: Takamasa Sakuragi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/041,285

(22) Filed: Mar. 3, 2008

(65) Prior Publication Data
US 2008/0217508 A1    Sep. 11, 2008

(30) Foreign Application Priority Data
Mar. 5, 2007 (JP) ............... 2007-054280
Feb. 27, 2008 (JP) ............... 2008-046902

(51) Int. Cl.
*H01L 27/00* (2006.01)
(52) U.S. Cl. ............... 250/208.1; 250/214 R; 250/214.1; 348/308; 257/292
(58) Field of Classification Search ............ 250/214 R, 250/208.1, 214.1; 348/308, 314, 241; 257/290–294
See application file for complete search history.

(56) References Cited

U.S. PATENT DOCUMENTS

| | | | |
|---|---|---|---|
| 5,654,537 A | 8/1997 | Prater | 250/208.1 |
| 6,965,111 B2 | 11/2005 | Endo | 250/370.11 |
| 7,038,215 B2 | 5/2006 | Endo | 250/370.11 |
| 7,098,461 B2 | 8/2006 | Endo | 250/370.09 |
| 7,227,151 B2 | 6/2007 | Endo | 250/370.09 |
| 2008/0073679 A1* | 3/2008 | Koyama et al. | 257/292 |

FOREIGN PATENT DOCUMENTS

| | | |
|---|---|---|
| JP | 57-162358 A1 | 10/1982 |
| JP | 1-117160 A1 | 5/1989 |
| JP | 10-308902 | 11/1998 |
| JP | 2001-111020 A1 | 4/2001 |
| JP | 2002-040144 | 2/2002 |
| JP | 2002-114276 A2 | 4/2002 |
| JP | 2005-175526 A1 | 6/2005 |

* cited by examiner

*Primary Examiner*—Seung C Sohn
(74) *Attorney, Agent, or Firm*—Fitzpatrick, Cella, Harper & Scinto

(57) ABSTRACT

A photoelectric conversion apparatus includes a photoelectric conversion element, an amplification transistor having a gate electrically connected to the output terminal of the photoelectric conversion element, a switching element having one terminal electrically connected to an electrical path which connects the output terminal of the photoelectric conversion element to the gate of the amplification transistor, and the other terminal electrically connected to a node capable of providing a voltage lower than the power supply voltage with the other terminal; and a control unit for controlling the voltage provided by the node and ON/OFF state of the switching element, wherein the control unit causes the node to provide the voltage lower than the power supply voltage with the other terminal of the switching element and turns on the switching element during a period in which a signal generated by photoelectric conversion of the photoelectric conversion element is not used.

10 Claims, 8 Drawing Sheets

F I G. 7
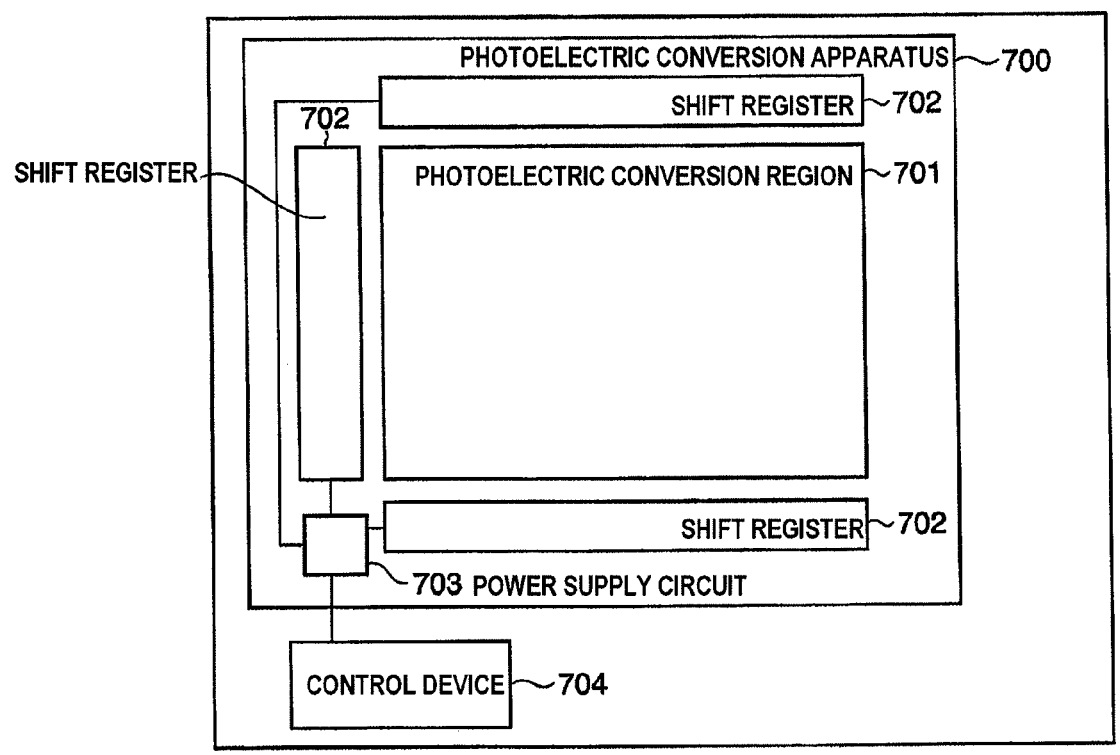

PHOTOELECTRIC CONVERSION APPARATUS, PHOTOELECTRIC CONVERSION SYSTEM, AND METHOD OF DRIVING THE SAME

BACKGROUND OF THE INVENTION

1. Field of the Invention

The present invention relates to a photoelectric conversion apparatus, a photoelectric conversion system, and a method of driving the same and, more particularly, to a photoelectric conversion apparatus and photoelectric conversion system having a p-n junction or a MOS transistor, and a method of driving the same.

2. Description of the Related Art

In, for example, a p-n junction of a sensor where photoelectric conversion occurs, the number of crystal defects grows due to X-rays and cosmic rays in the nature or X-rays generated from medical equipment using X-rays.

Since the defect amount increases along with the passage of time, long-term use of a sensor makes its performance unsustainable.

A conventional method of preventing such degradation keeps a semiconductor at a predetermined temperature, as described in Japanese Patent Laid-Open No. 2002-114276.

However, in the technique described in Japanese Patent Laid-Open No. 2002-114276, the anti-degradation effect is only provided when using a metal material such as lead. It is impossible to place such a film on the light-receiving surface of a photosensor. It is also impractical to keep a sensor at a predetermined temperature.

Generally, a MOS semiconductor element irradiated with radiation generates electron-hole pairs in its gate oxide film. The interface between the silicon and the silicon oxide film traps and accumulates the holes moving to there.

This causes impediments such as fluctuations of the threshold voltage, as is known.

A technique disclosed in Japanese Patent Laid-Open No. 57-162358 sets the power supply line or signal line to the ground potential when the element is not used under radiation irradiation so as to produce an annealing effect and release charges generated by radiation.

However, in the technique disclosed in Japanese Patent Laid-Open No. 57-162358, if the signal line connected to a photoelectric conversion element is set to the ground potential, and a photoelectric conversion operation is performed after potential application, electrons generated by the photoelectric conversion element make the potential of the signal line negative. Since the output circuit connected to the signal line cannot output a signal, image capturing is impossible.

A technique disclosed in Japanese Patent Laid-Open No. 2001-111020 fixes the terminals of a pixel except a photoelectric conversion element to a predetermined potential during at least a time determined by the area occupied by a driving circuit and the photoelectric conversion element.

However, in the technique disclosed in Japanese Patent Laid-Open No. 2001-111020, it is impossible to fix the potential of the terminals after the image sensing apparatus is powered off. While the image sensing apparatus is not used, degradation caused by X-rays is nonsuppressible. Additionally, since the photoelectric conversion element is excluded from the fixture, the electric field applied to it is not relaxed so no effect of preventing degradation by X-rays is expected.

A technique described in Japanese Patent Laid-Open No. 2005-175526 applies a refresh potential different from a normal reset potential to one terminal of a photoelectric conversion element to sweep holes staying in an intrinsic semiconductor layer included in the photoelectric conversion element.

However, in the technique described in Japanese Patent Laid-Open No. 2005-175526, the refresh potential applies a negative potential to the remaining terminals of the photoelectric conversion element and also applies an electric field having a magnitude of not 0 to the photoelectric conversion element. This technique cannot therefore prevent degradation by X-rays, either.

Japanese Patent Laid-Open No. 11-17160 discloses the following technique. When all terminals of a solid-state image sensing apparatus are open, the electric field applied to a transfer electrode between a pixel unit and a CCD and an oxide film under it is changed to zero. This suppresses a threshold value shift or an increase in the level of the interface between a semiconductor and an oxide film due to ion damage even when radiation irradiates the pixel unit of the CCD.

However, this technique does not assume anti-degradation under radiation irradiation in the pixel circuit arrangement of an amplification-type photoelectric conversion apparatus having, for example, an amplification MOS transistor in a pixel.

In a photoelectric conversion apparatus using a photoelectric conversion element, an increase in the leakage current greatly affects the quality of output signal. It is therefore necessary to minimize current leakage.

If a photoelectric conversion element includes a p-n junction, defects generated by X-rays or cosmic rays depend on the magnitude of the electric field applied to the p-n junction, as is apparent from experiments.

A normal photoelectric conversion apparatus is designed to stably operate using an external or internal parasitic capacitance when a voltage to be applied to the circuit is stably supplied. Most photoelectric conversion apparatuses have a large external capacitance of several ten μF connected between terminals such as the power supply terminal and GND terminal.

On the other hand, most analog circuits for processing a signal based on signal charges generated by a photoelectric conversion element are biased by a constant current. Hence, a predetermined current is supplied to the processing circuit independently of the magnitude of the power supply voltage.

As a characteristic feature, the constant current circuit stops its operation when the power supply voltage drops to a predetermined value or less, and after the stop, the resistance between the power supply and the GND becomes very high.

Hence, during an inoperative state of the photoelectric conversion apparatus, the power supply terminal voltage decreases to a predetermined value because of discharge caused by current consumption. At the voltage that stops the operation of the constant current circuit or less, the voltage tends to be maintained.

The photoelectric conversion unit basically must be used in a high impedance state. For this reason, after the terminating the operation of the photoelectric conversion apparatus, charges by, for example, the parasitic capacitance sometimes keep an electric field applied to the p-n junction of the photoelectric conversion unit for a very long time. This may cause degradation of the junction by X-rays.

The gate potential of a MOS transistor included in a pixel is rarely controlled to change to the ground potential every time the power is turned off. In this case, an electric field is kept applied between the gate and drain and between the gate and source of the MOS transistor even after power-off. Consequently, the electric field applied between the gate and source (or drain) of the MOS transistor generates a hot carrier, which is trapped by the gate oxide film and subsequently cause fixed noise signal or generates a substrate noise current.

SUMMARY OF THE INVENTION

The present invention provides for suppressing degradation of an output signal by X-rays or cosmic rays in an inoperative state of a photoelectric conversion apparatus.

According to the first aspect of the present invention, there is provided a photoelectric conversion apparatus comprising: a photoelectric conversion element; an amplification transistor having a gate electrically connected to an output terminal of the photoelectric conversion element, and a drain to which a power supply voltage is applied; a switching element having one terminal electrically connected to an electrical path which connects the output terminal of the photoelectric conversion element to the gate of the amplification transistor, and the other terminal electrically connected to a node capable of providing a voltage lower than the power supply voltage with the other terminal; and a control unit for controlling the voltage provided by the node and ON/OFF state of the switching element, wherein the control unit causes the node to provide the voltage lower than the power supply voltage with the other terminal of the switching element and turns on the switching element during a period in which a signal generated by photoelectric conversion of the photoelectric conversion element is not used.

According to the second aspect of the present invention, there is provided a method of driving a photoelectric conversion apparatus including a photoelectric conversion element, and an amplification transistor having a gate electrically connected to an output terminal of the photoelectric conversion element, and a drain to which a power supply voltage is applied, the method comprising the steps of: setting a period in which a signal generated by photoelectric conversion of the photoelectric conversion element is not used; and applying, at least during the period, a voltage lower than the power supply voltage to an electrical path which connects the output terminal of the photoelectric conversion element to the gate of the amplification transistor.

According to the third aspect of the present invention, there is provided a method of driving a photoelectric conversion system which has a photoelectric conversion apparatus including a photoelectric conversion element, and an amplification transistor having a gate electrically connected to an output terminal of the photoelectric conversion element, and a drain to which a power supply voltage is applied, and a control apparatus for controlling power supply to the photoelectric conversion apparatus, the method comprising the steps of: receiving, from the control apparatus, one of a trigger pulse to cut off power supply to the photoelectric conversion apparatus and a pulse representing an end of signal processing by the photoelectric conversion element; and applying a voltage lower than the power supply voltage to an electrical path which connects the output terminal of the photoelectric conversion element to the gate of the amplification transistor in accordance with the received pulse in the step of receiving.

According to the present invention, it is possible to suppress degradation of an output signal of a photoelectric conversion apparatus by X-rays or cosmic rays in an inoperative state of the photoelectric conversion apparatus.

Further features of the present invention will become apparent from the following description of exemplary embodiments with reference to the attached drawings.

BRIEF DESCRIPTION OF THE DRAWINGS

FIG. 7 is a schematic view of a photoelectric conversion system according to a preferred embodiment of the present invention.

DESCRIPTION OF THE EMBODIMENTS

Figure 1:
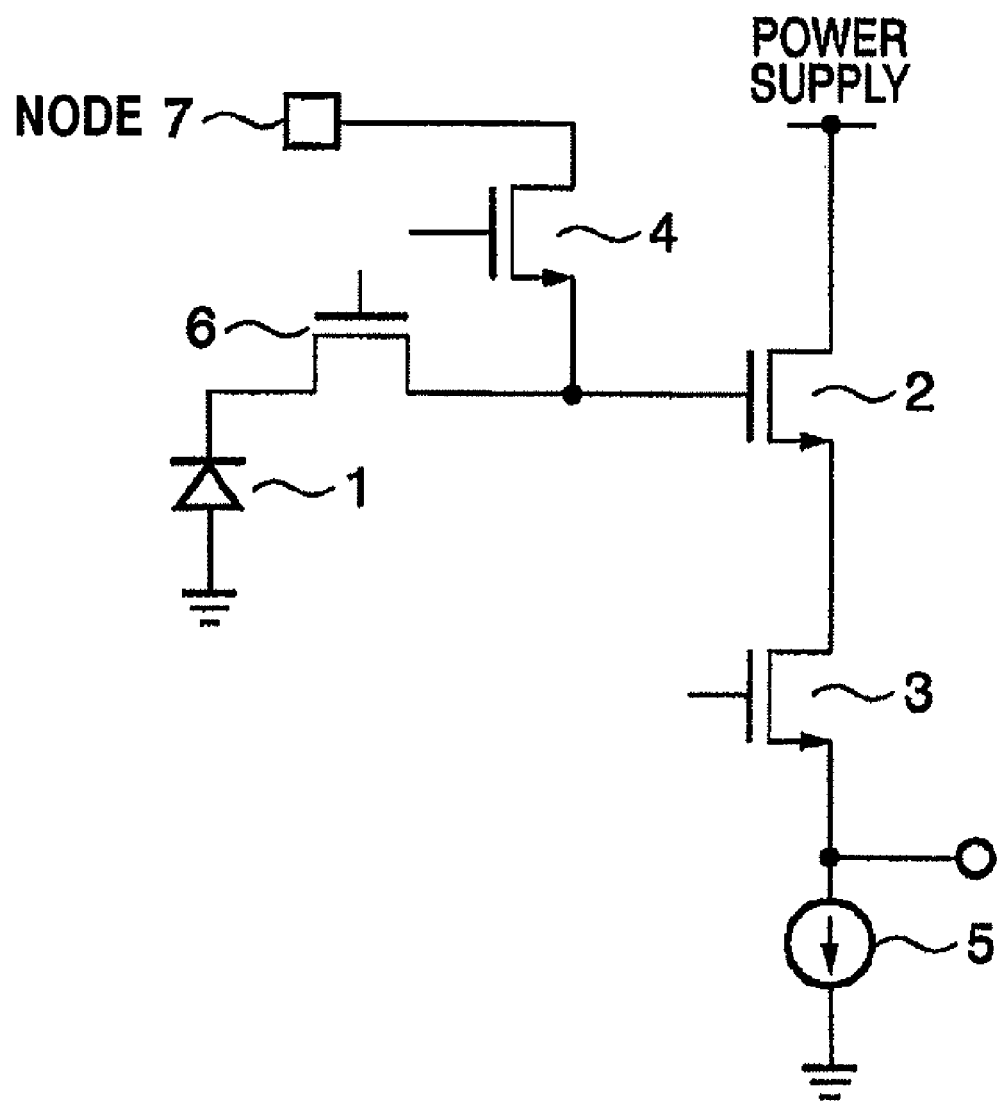
FIG. 1 is a circuit diagram showing a pixel unit of a photoelectric conversion apparatus according to a preferred first embodiment of the present invention.

The best mode for carrying out the present invention will now be described with reference to the accompanying drawings.

A MOS-type photoelectric conversion apparatus uses p-n junctions and MOS transistors arranged on a semiconductor substrate. Of the p-n junctions and MOS transistors, those which are connected to high-impedance nodes that float in an inoperative state most affect the photoelectric conversion characteristic due to damage caused by radiation or the like. The high-impedance nodes include a terminal of a capacitance which holds charges generated by a photoelectric conversion element. In an amplification-type photoelectric conversion apparatus having a source follower in part of a pixel circuit in, for example, conversion to a voltage, the high-impedance nodes include the input node of the source follower. In addition, the high-impedance nodes include all nodes electrically connected to an electrical path through which charges pass in the process of generating the charges by photoelectric conversion and of transferring the charges to the input node and of converting the charges into a voltage. Hence, the semiconductor region connectable to the input node of a source follower, such as the charge accumulation region of a photoelectric conversion element and the floating diffusion region, the source and drain region of a transfer switch, and the source region of a reset switch, most suffer the influence of radiation or the like.

In the present invention, a bias supply switch is provided to make an external electric field applied to the p-n junctions and the like connected to such high-impedance nodes preferably zero. The bias supply switch can nullify an external voltage applied to a semiconductor region (first semiconductor region) connected to the input node of the source follower, and a semiconductor region (second semiconductor region) that forms a p-n junction together with the first semiconductor region. That is, the bias supply switch has a function of relaxing the external electric field applied to, for example, the p-n junction. The bias supply switch is turned on in an inoperative state of the photoelectric conversion apparatus.

The bias supply switch relaxes the external electric field. However, the external electric field need not always be zero. An external electric field smaller than an electric field applied to the input node of the source follower at least during a period (operation time) of, for example, a signal read operation or reset operation using a signal generated by photoelectric conversion of the photoelectric conversion element can provide an effect. This will be described in more detail by exemplifying an arrangement that suppresses noise in an image signal by subtracting a noise signal such as an offset of a MOS transistor included in a pixel from a signal generated by photoelectric conversion. In this arrangement, the potential states of the input node of the source follower can include a state in which a reset transistor applies a reset voltage to a floating diffusion region and a state in which charges are read out from the photoelectric conversion element to the floating diffusion region. The electric field applied by the bias supply switch is made smaller than the external electric field applied to the above-described first and second semiconductor regions in driving the pixel.

The operation of the bias supply switch will be described next.

FIG. 7 is a schematic view of a photoelectric conversion system according to a preferred embodiment of the present invention. The system includes a photoelectric conversion apparatus 700. A photoelectric conversion region 701 has a plurality of pixels. Peripheral circuits 702 read out pixel signals. The peripheral circuits 702 drive the pixels. More specifically, the peripheral circuits 702 are blocks representing horizontal and vertical shift registers. When a shift operation finishes, the peripheral circuit 702 generates a drive end pulse. It is possible to generate, upon receiving the drive end pulse, a pulse which operates a switch to reduce an external voltage applied to the p-n junction of a pixel in the photoelectric conversion region 701.

The system also includes a power supply circuit 703 of the photoelectric conversion apparatus 700. When the power supply circuit 703 supplies power to the photoelectric conversion region 701 and the peripheral circuits 702, the photoelectric conversion apparatus 700 performs a photoelectric conversion operation. The system also includes a control device 704. The power supply circuit 703 supplies the power upon receiving a control pulse from the control device 704. The bias supply switch is ON/OFF-controlled on the basis of a trigger pulse supplied from the control device 704 to cut off power.

When the photoelectric conversion apparatus is operating, in other words, while the power is steadily supplied to the photoelectric conversion apparatus, control is performed to turn off the bias supply switch to avoid any impediments to normal operation.

Instead of providing a new switch in the photoelectric conversion region, a switch necessary for driving the pixels is used as the bias supply switch, thereby implementing the field relaxing function. More specifically, a reset switch is usable.

The electric field applied to the oxide film of a MOS transistor may be made zero by controlling a logic circuit operation of driving the gate of a MOS transistor such that the gate potential of the MOS transistor becomes equal to its channel potential immediately before power-off.

Figure 6:
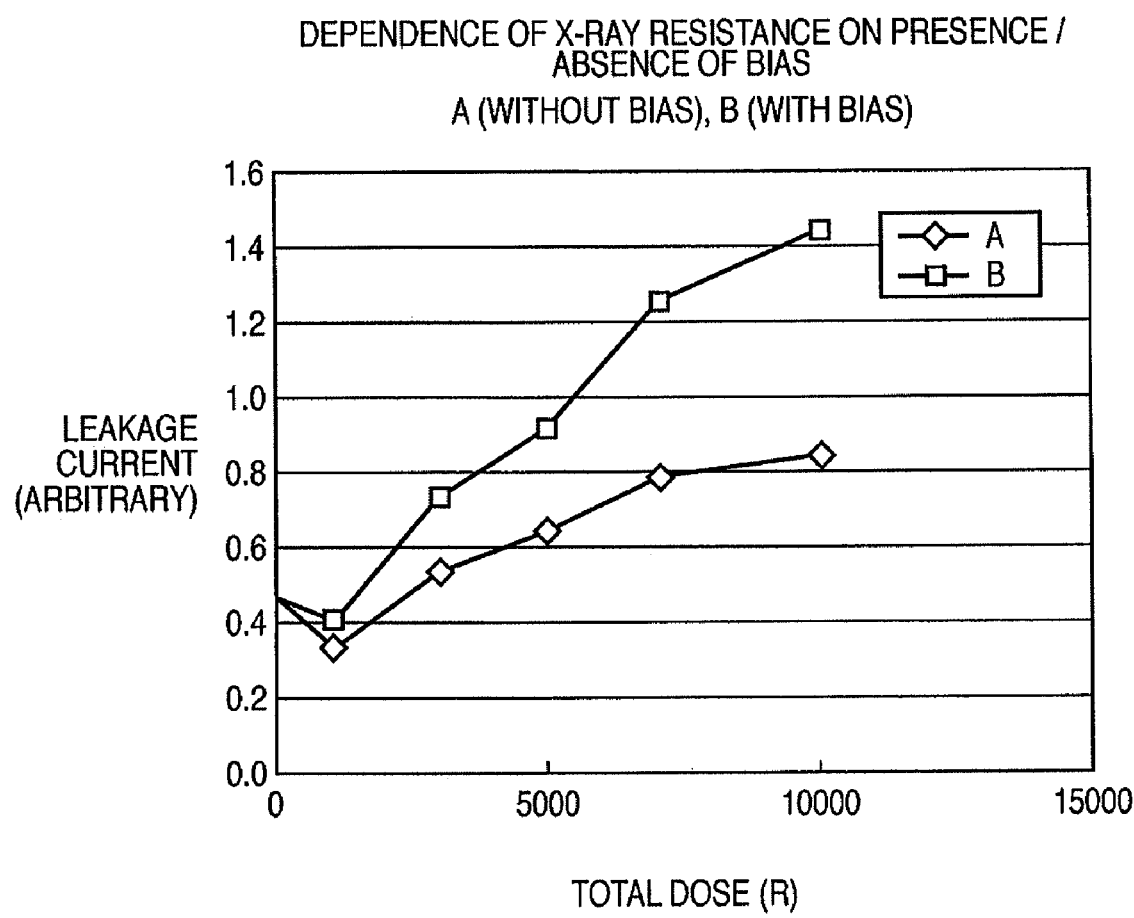
FIG. 6 is a graph showing an example in which the defect amount of a sensor is measured in a form of a leakage current by an electric field applied to a p-n junction or between the gate and drain/source of a MOS transistor.

The relationship between the applied electric field and the defect amount of the photoelectric conversion apparatus will be described next. FIG. 6 is a graph obtained by measuring a leakage current as the defect amount of the photoelectric conversion apparatus by the electric field applied to the p-n junction or between the gate and drain/source of a MOS transistor.

Referring to FIG. 6, the ordinate represents a leakage current value indicating the defect amount, and the abscissa represents the total dose of X-rays and cosmic rays. Reference letter A indicates a state without bias application to the p-n junction and the like, and reference letter B indicates a state in which a bias is applied. In state A, degradation is suppressed as compared with the state B.

Reference letter A in FIG. 6 indicates a curve by a driving method according to a preferred embodiment of the present invention. The electric field applied to a junction is smaller than in state B, and more specifically, zero. As compared to B, the leakage current generated by crystal defects decreases, as is apparent.

Hence, according to the present invention, in a period in which a signal generated by photoelectric conversion of the photoelectric conversion element is not used, the above-described bias applied to the p-n junction and the like is made smaller than in driving the pixels, thereby suppressing crystal defects.

More detailed embodiments of the present invention will be described below in detail. However, the present invention is not limited to these embodiments, and modifications and combinations can be made without departing from the scope of the present invention.

First Embodiment

FIG. 1 is a circuit diagram showing a pixel unit of a photoelectric conversion apparatus according to a preferred first embodiment of the present invention. A case in which electrons are used as signal charges will now be described.

Referring to FIG. 1, a photodiode 1 functions as a photoelectric conversion element. An amplification transistor 2 forms part of a source follower circuit, which outputs, at a low output impedance, a signal based on charges generated by photoelectric conversion. The gate of the amplification transistor 2 is electrically connected to the output terminal of the photodiode 1. A power supply voltage is applied to the drain of the amplification transistor 2. A selector switch 3 outputs the output signal of the amplification transistor 2 to a common signal line (not shown). Reference numeral 4 denotes a reset switch. The reset switch 4 is a switching element having one terminal electrically connected to an electrical path which connects the output terminal of the photodiode 1 to the gate of the amplification transistor 2, and the other terminal electrically connected to a node 7 to be described later. A constant current supply 5 for bias forms part of the above-described source follower circuit. A transfer switch 6 transfers charges from the photodiode 1 to the amplification transistor 2. The node 7 applies a reset voltage to the input node of the source follower circuit. The node 7 is designed to be capable of switching between the power supply voltage and a voltage (e.g., ground voltage) lower than the power supply voltage to provide one of the voltages. For example, MOS transistors are usable as the transfer switch 6, reset switch 4, selector switch 3, and amplification transistor 2. A control device 704 (see FIG. 7) serving as a control unit controls ON/OFF of the reset switch 4 and the voltage of the node 7. In this embodiment, the reset switch 4 is used as the above-described bias supply switch.

Figure 8:
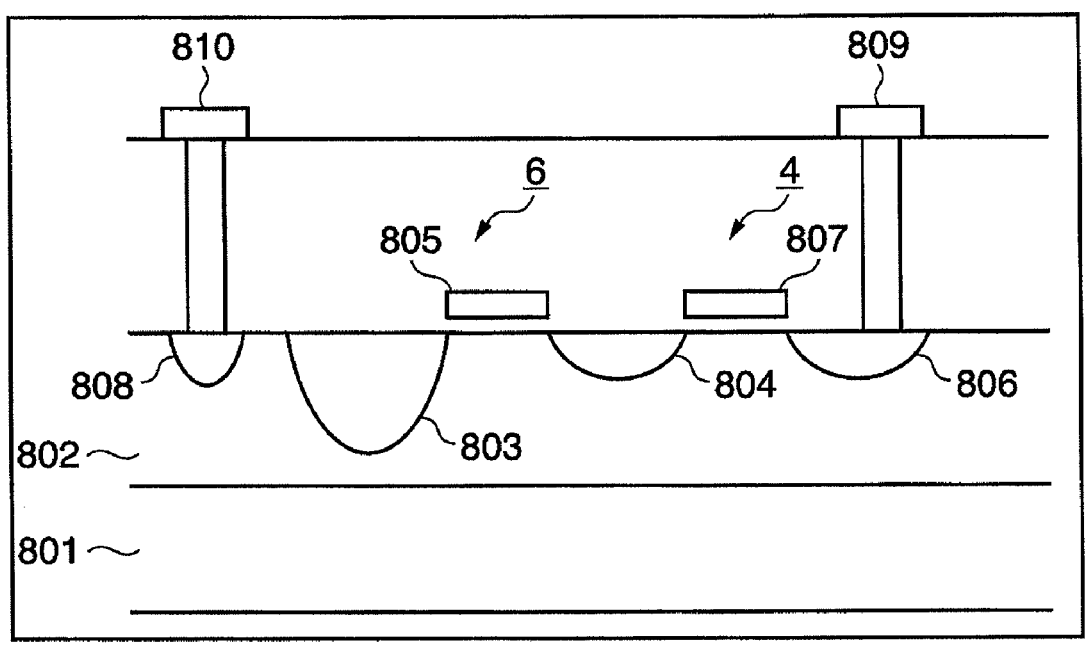
FIG. 8 is a sectional view of part of the pixel described with reference to FIG. 1.

FIG. 8 is a sectional view of part of the pixel described with reference to FIG. 1. The pixel has a semiconductor substrate 801 of a first conductivity type (n-type), a semiconductor region 802 of a second conductive type (p-type), and an n-type semiconductor region 803. As shown in FIG. 8, the n-type semiconductor region 803 forms a p-n junction together with the p-type semiconductor region 802 and forms the photodiode 1 serving as a photoelectric conversion element. The n-type semiconductor region 803 can also be called a charge accumulation region because it accumulates signal charges. Reference numeral 804 denotes an n-type floating diffusion region (FD region). The FD region 804 is connected to the gate electrode of the amplification transistor 2 (not shown). The n-type semiconductor region 803 is electrically connected to the input node of the source follower via the transfer switch 6.

A gate 805 of the transfer switch 6 transfers charges in the n-type semiconductor region 803 functioning as a charge accumulation region to the FD region 804. The regions 803 and 804 and the gate 805 form the transfer switch 6. Reference numeral 806 denotes an n-type drain region of the reset switch 4; and 807, a gate of the reset switch 4. The amplification transistor 2 and selector switch 3 (not shown) are also arranged.

A p-type semiconductor region 808 applies a reference voltage (ground voltage) to the p-type semiconductor region 802. An interconnection 809 applies a voltage to the drain of the reset switch 4. An interconnection 810 applies the reference voltage (ground voltage) to the p-type semiconductor region 808.

As is apparent from FIGS. 1 and 8, the n-type semiconductor region 803, transfer switch 6, and reset switch 4 are electrically connected to the input node of the source follower, which serves as a high-impedance node. Hence, the bias supply switch relaxes an electric field applied to them.

Figure 2:
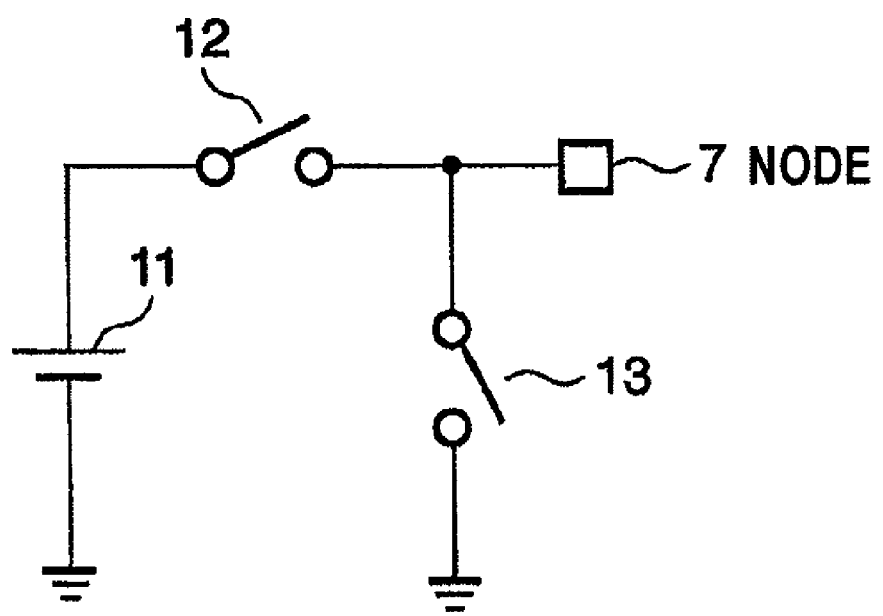
FIG. 2 is a circuit diagram showing a multiplex switch according to a preferred embodiment of the present invention.

FIG. 2 shows an example of a bias circuit which applies a voltage to the node 7. The above-described interconnection 809 (see FIG. 8) is connected to the node 7. A reset power supply 11 applies a voltage to reset the FD region 804 (see FIG. 8). A switch 12 outputs a reset voltage to the node 7. A switch 13 applies the ground voltage to the node 7. In this embodiment, the field relaxing voltage applied to the drain region 806 (see FIG. 8) of the reset switch 4 equals the reference voltage (ground voltage) applied to the p-type semiconductor region 802.

Figure 5:
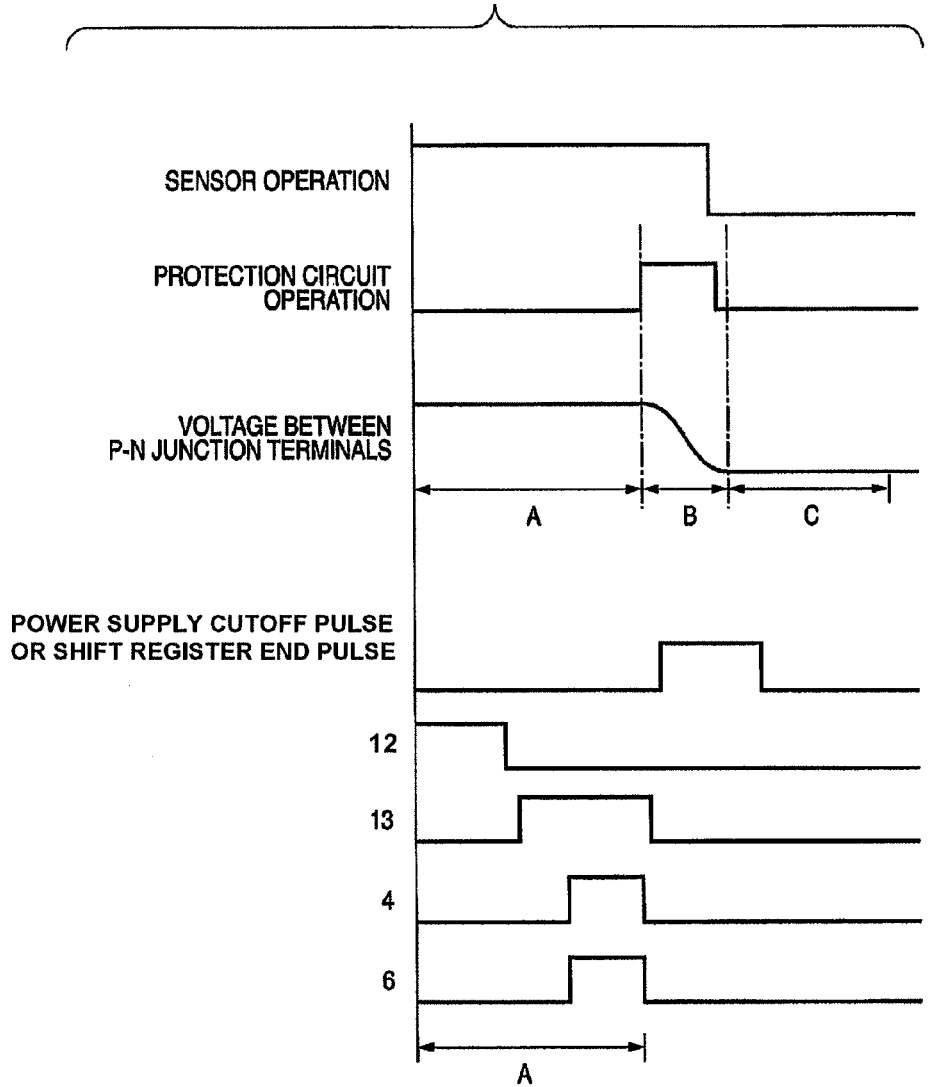
FIG. 5 is a timing chart showing an operation timing according to a preferred embodiment of the present invention.

FIG. 5 is a timing chart showing an operation timing according to this embodiment.

A pulse 12 is supplied to the control terminal of the switch 12 in FIG. 2. A pulse 13 is supplied to the control terminal of the switch 13 in FIG. 2. A pulse 4 is supplied to the control terminal of the reset switch 4 in FIG. 1. A pulse 6 is supplied to the control terminal of the transfer switch 6 in FIG. 1. All the switches are active when their control terminals receive high level signals. A power cutoff pulse is a pulse supplied from the control device 704 to the power supply circuit 703 in FIG. 7. This pulse cuts off the power supplied to the photoelectric conversion apparatus 700. The bias supply switch (the reset switch 4) is turned on (after the switch 12 in FIG. 2 is turned off and the switch 13 becomes turned on) immediately before cutting off the power to the photoelectric conversion apparatus (during a time period A in FIG. 5). At this time, the circuit shown in FIG. 2 selects and applies, via the node 7 to the region 806, a voltage (ground voltage) equal to the reference voltage applied to the p-type semiconductor region 802 of the photoelectric conversion element. Control is performed to make the ON time of the reset switch 4 and that of the transfer switch 6 at least partially overlap with the ON time of the switch 13 in FIG. 2 to provide the voltage with the n-type semiconductor regions 804, 803.

This enables the nullification of the electric field applied to the p-n junction of the photodiode 1, and those between the source and well and between the drain and well of each of the reset switch 4 and the transfer switch 6 (during a time period B, C in FIG. 5).

Additionally, the function of a logic circuit (not shown) which drives the gates of the MOS switches included in the reset switch 4 and the transfer switch 6 is set so as to apply the ground potential during the time period B, C in FIG. 5. However, if the switches are PMOS transistors, a power supply potential is set.

According to this embodiment, it is possible to suppress degradation of an output signal by X-rays or cosmic rays in an inoperative state of the photoelectric conversion apparatus. Additionally, a reset switch normally used in a pixel of an amplification-type photoelectric conversion apparatus is used as a bias supply switch by switching the voltage applied to the drain of the reset switch between the reset voltage and the field relaxing voltage. This can obtain the above-described effect without the addition of any special component.

It should be noted that, during the period B, a protection circuit (not shown) may be activated to protect the p-n junctions from the fluctuating voltage as shown in FIG. 5.

Second Embodiment

Figure 3:
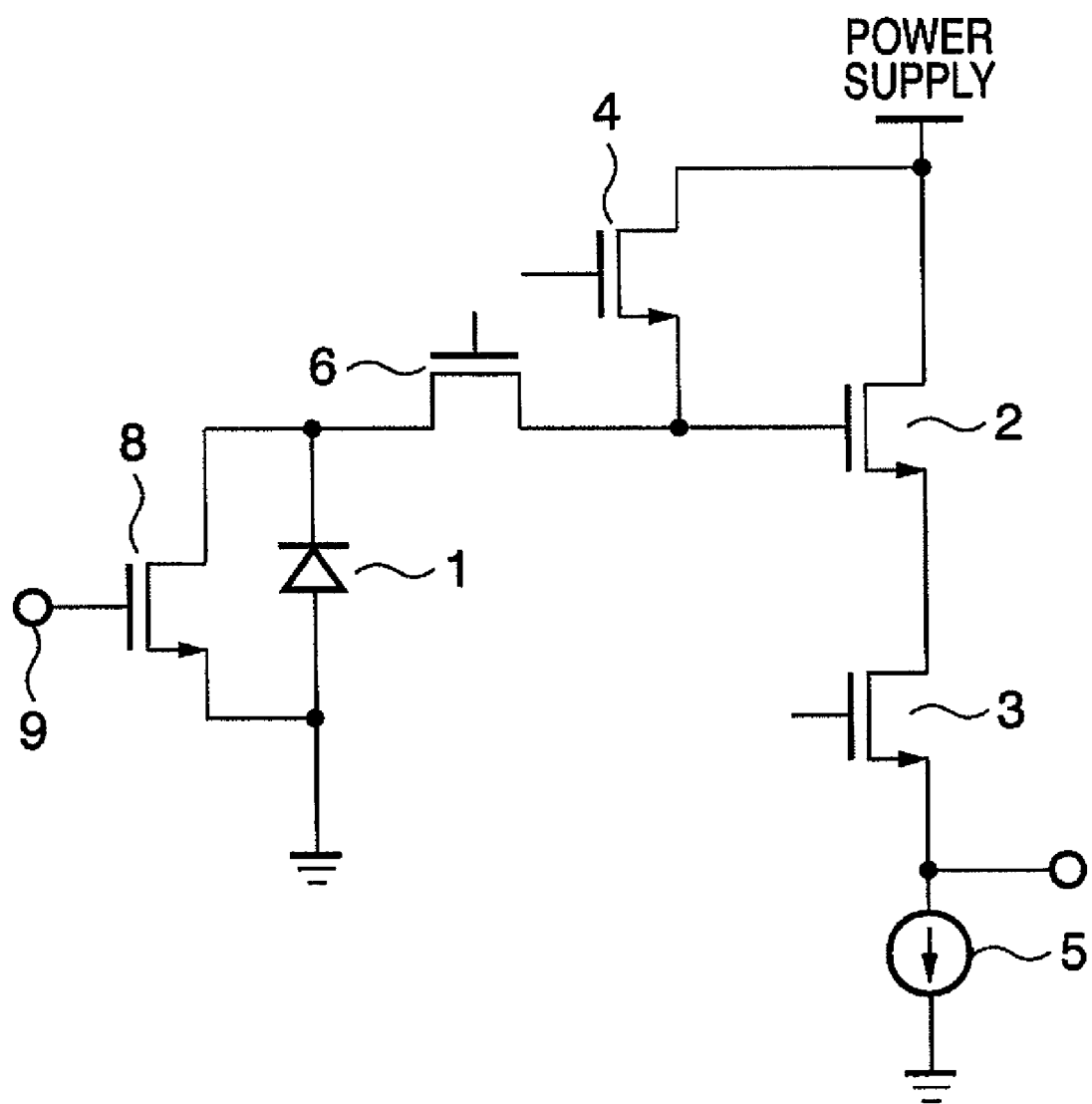
FIG. 3 is a circuit diagram showing a pixel unit of a photoelectric conversion apparatus according to a preferred second embodiment of the present invention.

FIG. 3 is a circuit diagram showing a pixel unit of a photoelectric conversion apparatus according to a preferred second embodiment of the present invention. In this example, a bias supply switch is newly arranged in a photoelectric conversion circuit. The same reference numerals as in FIG. 1 denote the same components in FIG. 3, and a detailed description thereof will not be repeated.

Referring to FIG. 3, the circuit has a bias supply switch 8 and a control terminal 9 which is used to drive the bias supply switch 8. The bias supply switch 8 connects a p-type semiconductor region of a photodiode 1 to an n-type semiconductor region to reduce an external voltage applied to these regions.

Before the photoelectric conversion apparatus becomes inoperative after the end of the photoelectric conversion operation, a pulse for turning on the bias supply switch 8 is supplied to the terminal 9 to turn on the bias supply switch 8, and simultaneously another pulse for turning on a transfer switch 6 is supplied to its control terminal to turn on the transfer switch 6. This enables the nullification of the electric field applied to the p-n junction of the photodiode 1, those between the source and well of the transfer switch 6 and of the reset switch 4, and those between the drain and well of the transfer switch 6.

In this embodiment, the circuit can be driven in the same way as in the first embodiment. More specifically, the pulse to be supplied to the terminal 9 (the similar pulse as the pulse 4 in FIG. 5) is generated on the basis of a power cutoff pulse from a control device 704 described with reference to FIG. 7.

According to this embodiment as well, because the electric field applied to the p-n junction of photodiode, and the p-n junction of source/drain and well can be relaxed or nullified, it is possible to suppress degradation of an output signal by X-rays or cosmic rays in an inoperative state of the photoelectric conversion apparatus.

Third Embodiment

Figure 4:
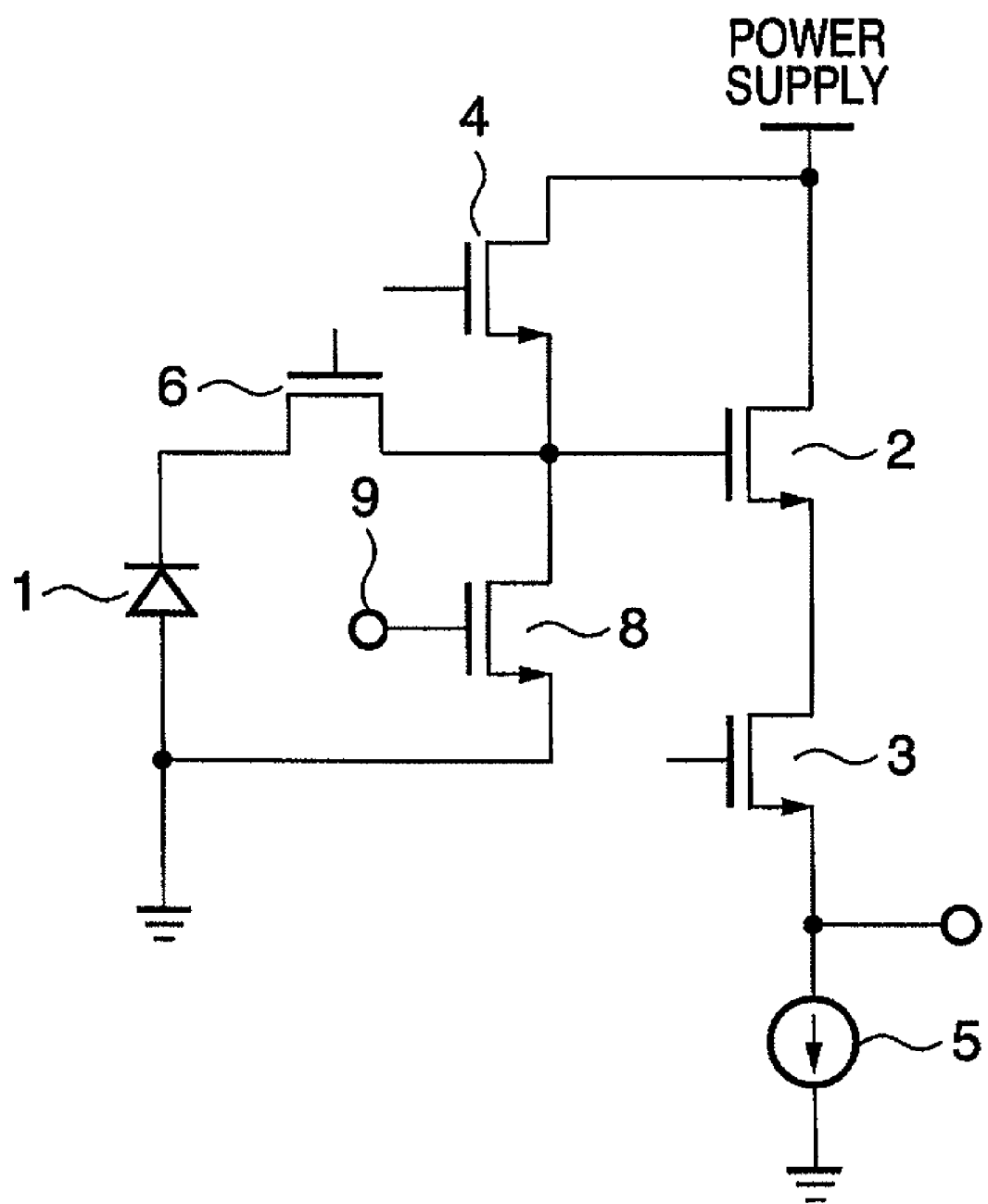
FIG. 4 is a circuit diagram showing a pixel unit of a photoelectric conversion apparatus according to a preferred third embodiment of the present invention.

FIG. 4 is a circuit diagram showing a pixel unit of a photoelectric conversion apparatus according to a preferred third embodiment of the present invention.

In the second embodiment, the bias supply switch 8 is electrically connected in parallel to the photodiode 1 and a transfer switch 6. In the third embodiment, a bias supply switch 8 is electrically connected between a ground interconnection and the gate of an amplification transistor 2.

In this embodiment, the electric field applied to the p-n junction of a photodiode 1 can be made zero by simultaneously turning on the transfer switch 6 and the bias supply switch 8 immediately before the photoelectric conversion apparatus becomes inoperative. This enables the nullification of the electric field applied to the p-n junction of the photodiode 1, those between the source and well of the transfer switch 6 and of the reset switch 4, and those between the drain and well of the transfer switch 6.

In this embodiment, the circuit can be driven in the same way as in the first embodiment. More specifically, the pulse to be supplied to a terminal 9 (the similar pulse as the pulse 4 in FIG. 5) is generated on the basis of a power cutoff pulse from a control device 704 described with reference to FIG. 7.

According to this embodiment as well, because the electric field applied to the p-n junction of photodiode, and the p-n junction of source/drain and well can be relaxed or nullified, it is possible to suppress degradation of an output signal by X-rays or cosmic rays in an inoperative state of the photoelectric conversion apparatus.

The present invention has been described above in detail. The present invention is not limited to these embodiments, as described above. For example, the signal charges have been described as electrons. However, holes can also be used as the signal charges by inverting the conductivity types of the semiconductor regions. Each of the above-described arrangements includes a transfer switch. The present invention is also applicable to an arrangement which connects the charge accumulation region of a photodiode to the input node of a source follower directly without an intervening switch. In this case, the arrangement need only relax an electric field applied to at least the photodiode. That is, the effect of the present invention is obtained by providing a switch which reduces an external voltage applied to the p- and n-type semiconductor regions of the photodiode.

The present invention is usable for a photoelectric conversion apparatus used as, for example, a sensor of a camera.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-054280, filed Mar. 5, 2007, and 2008-046902, filed Feb. 27, 2008, which are hereby incorporated by reference herein in their entirety.

What is claimed is:

1. A photoelectric conversion apparatus comprising:
   a photoelectric conversion element;
   a floating diffusion region;
   a transfer switch which transfers charges generated by the photoelectric conversion element to the floating diffusion region;
   an amplification transistor having a gate electrically connected to the floating diffusion region, and a drain to which a power supply voltage is applied;
   a switching element having one terminal electrically connected to an electrical path which connects the floating diffusion region to the gate of the amplification transistor, and the other terminal electrically connected to a node capable of providing a voltage lower than the power supply voltage with the other terminal; and
   a control unit for controlling ON/OFF state of the transfer switch and the switching element,
   wherein the control unit simultaneously turns on the transfer switch and the switching element while the voltage lower than the power supply voltage is provided with the other terminal of the switching element by the node, in accordance with an input of a trigger pulse.

2. An apparatus according to claim 1, wherein
   the control unit changes a state where the power supply voltage is provided with the other terminal of the switching element into a state where the voltage is provided lower than the power supply voltage with the other terminal of the switching element, in accordance with an input of the trigger pulse.

3. An apparatus according to claim 2, further comprising:
   a bias circuit which selectively applies the power supply voltage and the voltage lower than the power supply voltage to the node,
   wherein the other terminal of the switching element is electrically connected, via the node to the bias circuit, and
   wherein the control unit changes a state where the power supply voltage is provided with the node by the bias circuit into a state where the voltage lower than the power supply voltage is provided with the node by the bias circuit, in accordance with an input of the trigger pulse.

4. An apparatus according to claim 1, wherein the voltage lower than the power supply voltage is a ground voltage.

5. An apparatus according to claim 4, wherein the other terminal of the switching element is electrically connected to a ground terminal of the photoelectric conversion element, and
   wherein the control unit changes a state where the switching element is turned off into a state where the switching element is turned on, in accordance with an input of the trigger pulse.

6. A photoelectric conversion apparatus comprising:
   a photoelectric conversion element;
   a floating diffusion region;
   a transfer switch which transfers charges generated by the photoelectric conversion element to the floating diffusion region;
   an amplification transistor having a gate electrically connected to the floating diffusion region, and a drain to which a power supply voltage is applied;
   a switching element having one terminal electrically connected to an electrical path which connects the floating diffusion region to the gate of the amplification transistor, and the other terminal electrically connected to a ground interconnection; and
   a control unit for controlling ON/OFF states respectively of the transfer switch and the switching element, and
   wherein the control unit simultaneously turns on the transfer switch and the switching element.

7. A method of driving a photoelectric conversion apparatus including a photoelectric conversion element, a floating diffusion region, a transfer switch which transfers charges generated by the photoelectric conversion element to the floating diffusion region, and an amplification transistor having a gate electrically connected to the floating diffusion region, and a drain to which a power supply voltage is applied, the method comprising the steps of:
   receiving a trigger pulse; and
   performing an applying operation for applying a voltage lower than the power supply voltage to an electrical path which connects the floating diffusion region to the gate of the amplification transistor and turning on the transfer switch simultaneously with the applying operation, in accordance with the trigger pulse received in the step of receiving.

8. A method according to claim 7, wherein the trigger pulse includes a power cutoff pulse to the photoelectric conversion apparatus.

9. A method according to claim 7, wherein the trigger pulse includes a drive end pulse of a horizontal shift register for reading out a signal from the photoelectric conversion apparatus.

10. A method of driving a photoelectric conversion system which has a photoelectric conversion apparatus including a photoelectric conversion element, a floating diffusion region, a transfer switch which transfers charges generated by the photoelectric conversion element to the floating diffusion region and an amplification transistor having a gate electrically connected to the floating diffusion region, and a drain to which a power supply voltage is applied, and a control apparatus for controlling power supply to the photoelectric conversion apparatus, the method comprising:

a first step, in which the photoelectric conversion apparatus receives a trigger pulse from the control apparatus; and a second step, in which the photoelectric conversion apparatus performs an applying operation for applying a voltage lower than the power supply voltage to an electrical path which connects the floating diffusion region to the gate of the amplification transistor and turns on the transfer switch simultaneously with the applying operation, in accordance with the trigger pulse received in the first step.

* * * * *